Sept. 5, 1967 J. B. MINTER 3,340,440
MULTI-CIRCUIT SEPARABLE CONNECTOR FOR PRINTED CIRCUIT BOARDS AND THE LIKE
Original Filed June 3, 1964 2 Sheets-Sheet 1

INVENTOR
JERRY B. MINTER
BY John J. Logan
ATTORNEY

INVENTOR
JERRY B. MINTER
BY John J. Rogan
ATTORNEY

United States Patent Office 3,340,440
Patented Sept. 5, 1967

3,340,440
MULTI-CIRCUIT SEPARABLE CONNECTOR FOR PRINTED CIRCUIT BOARDS AND THE LIKE

Jerry B. Minter, Normandy Heights Road, Morristown, N.J. 07960

Continuation of application Ser. No. 374,559, June 3, 1964. This application Mar. 15, 1966, Ser. No. 534,531
6 Claims. (Cl. 317—101)

This application is a continuation of application Ser. No. 374,559, June 3, 1964, which is a continuation-in-part of application Ser. No. 121,524, filed July 3, 1961, both of which are abandoned.

This invention relates to quickly detachable circuit connector arrangements for electric circuits of a wide variety of kinds.

A principal object of the invention is to provide an improved and simplified quickly detachable circuit connector arrangement, which is particularly advantageous in making and breaking a multiplicity of circuits such, for example, as those using so-called printed circuit boards.

Another object is to provide a novel metal clip contact construction which by reason of its configuration of design is highly efficient in forming a separable connector for high frequency circuits wherein low inherent capacitance and low resistance of the contacting parts are required.

A feature of the invention relates to an improved electrical contact clip which can be expeditiously assembled in a printed circuit board or similar panel member.

Another feature relates to a multiple contact board of insulation having a multiplicity of pairs of perforations, each pair receiving the outer legs of a wire contact clip of generally M-shape configuration, while the reentrant legs of the M abut against the surface of the board or panel to protect the clip from excessive deformation pressure during the board plugging-in operation.

Another feature relates to a metal contact clip for printed circuit boards and the like and formed of a single length of round spring wire stock of generally M-shape conformation, whereby the clip has predetermined lateral flexibility while maintaining substantially uniform pressure contact with a cooperating plugged-in contact strip or board.

A further feature relates to the novel organization, arrangement and relative location and interconnection of parts which cooperate to provide an improved quickly detachable circuit connector.

Other features and advantages not specifically enumerated will be apparent after a consideration of the following detailed descriptions and the appended claims.

Figures 1, 2, 3, 4, 5, 6, 7:
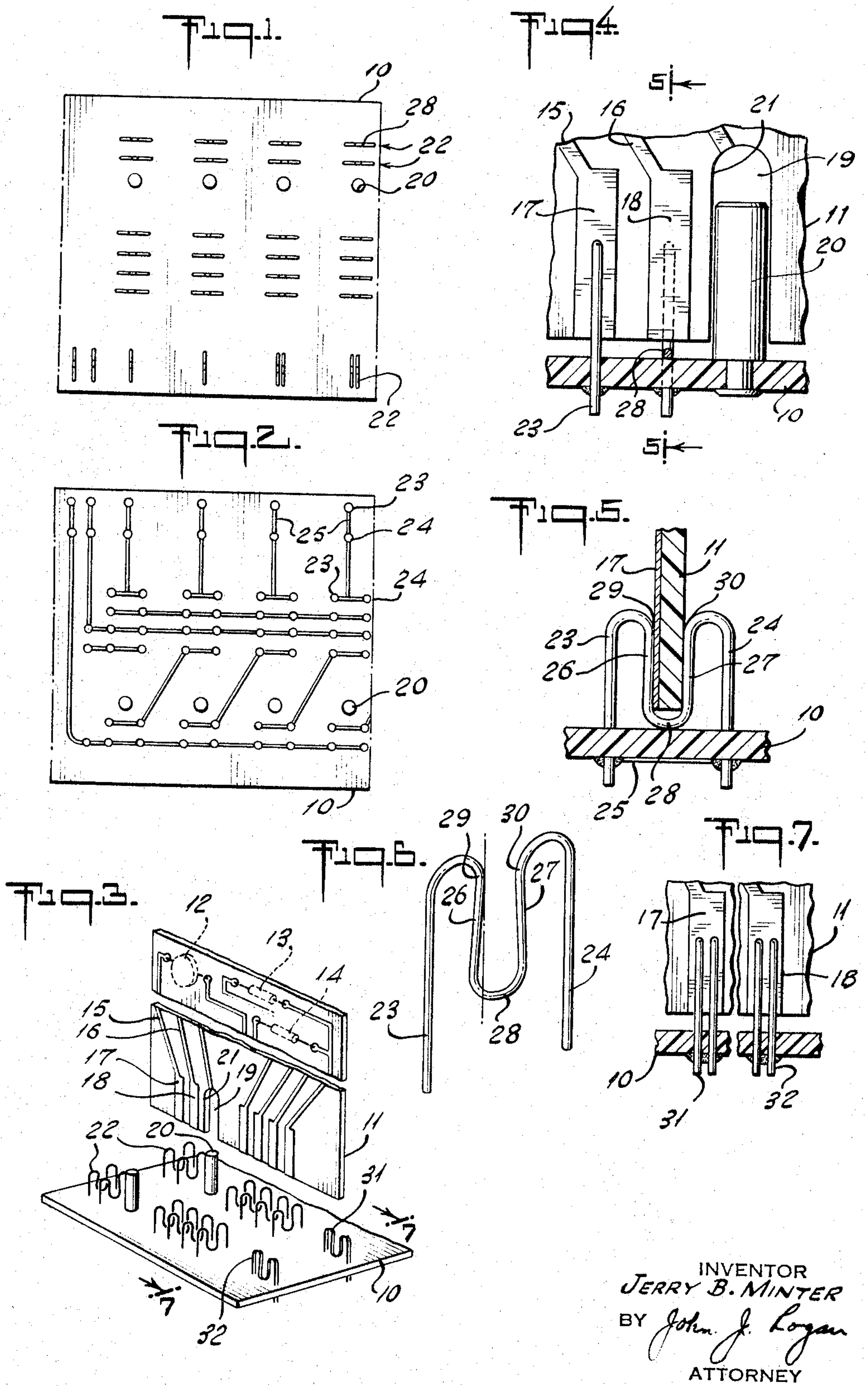
FIG. 1 is a top plan view of part of a separable connector board or panel embodying the invention.
FIG. 2 is a bottom plan view of FIG. 1.
FIG. 3 is a perspective view of the two parts of a separable connector according to the invention with the two parts shown in unplugged relation.
FIG. 4 is an enlarged view of the parts of FIG. 3 when they are in plugged-in relation.
FIG. 5 is a sectional view of FIG. 4 taken along the line 5—5 thereof.
FIG. 6 is a perspective view of one of the contact clips according to the invention.
FIG. 7 is a sectional view similar to that of FIG. 4, but taken along the line 7—7 of FIG. 3.

While the invention finds its primary utility with respect to separable connectors of the so-called printed board kind, and is so illustrated, it will be understood that the invention in certain of its aspects is equally applicable to other kinds of circuit connectors. However, in the printed circuit art, especially when using high frequency circuits, it is important not only that the circuit changes be made expeditiously, for example by plugging-in any one of a number of printed circuit boards in a single plug-in operation, but also the contact arrangement must have a minimum of contact resistance and must be of minimum inherent capacitance. Furthermore, the arrangement must be such as to be used with plug-in boards of planar, circular, or other curved on non-planar shape. Additionally, it is important in the interest of cost to provide a separable contacting arrangement wherein the flexible contact elements can be manufactured from a single length of spring wire of round cross section, and adapted to be connected to the printed circuit strip or board by a simple solder-dipping operation or the like.

There are certain problems which are involved in the use of separable connectors which are to be used with rigid printed circuit boards and the like. Thus in such arrangements where a positive and electrically wiping contact is required between the base board and the plug-in board, it is requisite that during the assembly of the boards the cooperating contact strips on the plug-in board be subjected to a wiping pressure engagement with the respective contact elements in the base board. Furthermore, since the printed circuit strips on the plug-in board are usually mere platings, it is extremely important that the wiping action be obtained without scratching or scoring of such strips. While it has been proposed heretofore to make the contact clips in the base board of a flat metal or ribbon stock, it has been found that such stock, because of its sharp edges tends to scratch or score the cooperating plated film contacts on the plug-in board. This phenomenon is particularly bothersome where the base board is designed with a great number of normally aligned contact clips. Thus, if a series of flat metal contact clips are assembled in a rigid insulating base or board, when the cooperating rigid printed circuit board is plugged into the base board, unless the insertion is carefully done by making sure that the inserted board is in proper linear alignment with the mouths of the flat metal clips, there is the tendency to subject one or more of the flat metal clips to a slight twisting action. This tends to present one or more sharp knife-like edges of the flat metal stock to the printed film. Therefore, continued insertion pressure may cause these edges to scratch or score the plated contacts. In an attempt to solve this difficulty, it has been proposed heretofore to design the flat metal springs so that when the printed board is plugged in, the mouths of the various clips are wider than the thickness of the printed board so that there is no wiping engagement during the assembly. In order to effect the electrical connection it is necessary, therefore, to design the clip so that the pressure of the edge of the inserted board deforms the clip in such a way as to close the mouth against the contact strip. In such an arrangement separate anchoring means is usually required in the form of a latching arrangement to retain the plugged in board in its contacting position. Apart from the cost and expense of such special latching means is the fact that the operator must force the edge of the board against the bottom of the clip to effect its distortion thus introducing the liability of damaging or even permanently deforming the clip.

Additionally, because of the fact that the flat metal type of clip must bear the complete insertion load of the printed circuit board, the flat type of clip must be of considerable width. This greatly reduces the number of such clips that can be assembled in the base board per unit area. It also increases the weight of the complete assembly as well as increasing the undesirable inherent electrostatic capacity between adjacent clips which, because of circuit requirements should be as far as possible electrostatically decoupled. It has also been found that when metal clips of flat metal stock are employed, the difficulty of mechanically inserting and anchoring such clips in relatively thin insulating base board is greatly increased.

Finally, one of the serious problems encountered in so-called printed circuit separable connectors is that the clip ends in the base board must protrude therefrom so as to be capable of soldering or welding to an extremely thin printed circuit "wiring" on the reverse side of the base board. Therefore, any excessive pressure exerted on the clip when the plugged-in board is inserted into the clip tends to disrupt or break the electrical connection between the protruding clip ends and the associated extremely thin printed circuit "wiring." According to the present invention, all the above noted and other difficulties are overcome by using contact clips which are of relatively thin rounded cross-sectional wire stock, and so shaped that each clip provides a positive wiping action and also it is located in the associated base board to prevent the force of insertion of the plugged-in board from permanently distorting the clip and protecting the electrical connection between the protruding ends of the clip and the printed wiring from being disrupted.

As shown in FIG. 3, the separable connector may comprise two boards or panels 10, 11 of suitable insulating material and, for convenience of description, these boards may be referred to respectively as the base board and the plug-in board. The plug-in board 11 carries on one surface a number of circuit elements such for example as capacitors, transistors, resistors, etc., which are to be interconnected to form any desired predetermined electric circuit conformation to constitute for example an oscillator, detector, amplifier, etc. Merely for illustration, the drawing shows in FIG. 3 a single transistor 12, the capacitor 13 and a resistor 14. The leads from these elements pass through respective perforations in board 11 and on the opposite side of that board they are dip-soldered to corresponding printed conductor strips 15, 16, etc., which terminate in respective parallel spaced terminal strips 17, 18, etc., adjacent the lower edge of board 11. In accordance with one feature of the invention, the said lower edge at any predetermined point has a cut-out keyway 19 which is adapted to register with a corresponding metal key or boss 20 carried by the base board 10. Furthermore, the orientation of the keyway 19 with respect to the key 20 insures that the board 11 can be plugged-in to the board 10 in only one particular relation, and for that purpose preferably the key 20 has a length such that it projects above the upper ends of the metal contacting clips 22 carried by board 10.

Each of these latter metal clips, as shown more clearly in FIG. 6, consists of a single length of spring wire such for example as a suitable beryllium copper alloy for imparting the desired flexibility and mechanical strength to the wire stock. Each clip is of generally M-shape conformation wherein the outer legs 23, 24 are substantially parallel and pass through respective perforations in the board 10. Preferably these perforations are only slightly larger than the cross section of the wire stock so that each clip is a press fit within the board. The legs 23, 24, therefore, protrude beneath the lower face of board 10, as shown more clearly in FIGS. 4 and 5. Each pair of legs is bridged by a respective conductive strip or film 25 printed on the said lower surface of the board 10 so that the two legs 23, 24 are connected in parallel merely by dip-soldering of the said protruding legs, this electrical connection being shown more clearly in FIG. 5. By reason of this parallel soldering operation of the protruding legs of each clip, the clip is firmly anchored against rattling or dislodgment within board 10.

The reentrant legs 26, 27 terminate in a somewhat rounded bight 28 which abuts against the upper surface of the board 10. Thus, the clip is assembled in the board by pushing the legs 23, 24 through the respective perforations in the said board until the bight 28 engages the upper face of board 10. It will be observed that in the normal condition the spring clip is so arranged that the legs 26, 27 are slightly inclined or biased toward each other so as to provide somewhat rounded contacting areas 29, 30 for engaging the corresponding terminal strip 17, 18, etc., on the plug-in board 11 with a wiping action. It should be observed that the spacing between the rounded contact areas 29, 30 is normally somewhat less than the thickness of the board 11 with its plated contact strips 17 so that when the board 11 is plugged into position, a uniform resilient contact pressure and wiping action is provided between the clip and the plated coatings on the board 11.

Consequently, when the plug-in board is inserted into place as shown in FIG. 4 by aligning the keyway 19 with the key 20, any excessive pressure on the board does not permanently distort the contact strip by reason of the fact that the bight 28 is backed-up by its abutment against the insulator board 10. It will be understood, of course, that the plug-in board 11 with its contacting terminal strips 17, etc., has a total thickness which is slightly greater than the normal spacing between the rounded portions 29, 30 of the contact clip so that as the board 11 is plugged-in to the board 10, the said rounded areas 29, 30 of each clip are in spring pressed wiping engagement with the opposite surfaces of the board 11, thus maintaining a uniform contact pressure between each clip and its respective printed circuit terminal 17, etc., but without danger of scraping or scoring the surface of terminal 17.

While the invention shows in FIG. 3 a single plug-in board 11 cooperating with one aligned row of contact clips, it will be understood, of course, that another similar plug-in board may be plugged-in to another row of contact clips. Furthermore, if desired, the board 10 may be provided with contact clips which are arranged at right angles or at any other desired angle with respect to the remaining clips. Thus, as shown in FIG. 3, the clips 31, 32 are assembled in the board 10 at right angles to the remaining clips. This permits a separate plug-in board to be plugged-in at right angles to the board 11.

It will be understood, of course, that the invention is not limited to the arrangement of the contact clips in linear array. They may be mounted in the board 10 in circular or any other non-linear array, thus permitting the plug-in board 11 to be of cylindrical or other non-linear construction with the terminal contact strips 17, 18 arranged so as to register with the appropriate spring clips when the cylindrical or non-planar plug-in board is keyed into the base board 10.

With the foregoing described contact clip and printed circuit board combination, it is possible to predesign and fix all the appropriate circuit connections without any danger of false circuit connections which tend to arise where the conventional circuit wiring and contacting arrangements are employed. Furthermore, since each of the clips has extremely low inherent capacity and extremely low contact resistance and with the legs of each clip directly short circuited at the protruding ends, it is possible to interconnect various circuit elements while preserving the proper impedance relations between the interconnected elements. This arrangement has been found to be satisfactory for the interconnection of circuit elements designed to operate at extremely high frequencies of the order of one thousand megacycles per second or even higher. It has been found that the interconnection of the various circuit elements at such high frequencies, using the clip contact and printed circuit arrangement as described and as shown, enables the voltage standing wave ratio between interconnected elements to be greatly reduced as compared with conventional printed circuit devices.

Furthermore, each set of base board and plug-in boards may constitute in themselves a complete system, for example an oscillator, a detector, an amplifier, frequency divider, etc. In other words, each such system is prefabricated and preprinted in two separable elements, namely a plug-in board and a base board. For example, let it be assumed that the particular plug-in board 11 shown in FIG. 3 is part of an amplifier system and carries the usual amplifier circuit elements such as the elements 12, 13 and 14, which are connected to the metallic preprinted strips 15, 16, etc., terminating in the respective contact strips 17, 18. One row of M-shape spring contacts in the base board 10, into which the board 11 is to be plugged, will have the said clips interconnected by preprinted metallic strips so as to constitute the complementary part of the complete amplifier. Another row of the M-shape clips may receive a separate and distinct plug-in board which may carry, for example, the elements of an oscillator or other similar system, and the corresponding M-shape clips into which that board is plugged will be interconnected by preprinted conductive strips so as to constitute with the second plug-in board a complete oscillator unit. Additional rows of M-shape contact strips may be provided in the base board 10 to receive the correlated plug-in board to form for example an entirely different unit or system, such for example as a detector or frequency divider. By this arrangement, therefore, the plug-in board and base board can be prefabricated for any desired complete system or units without danger of false wirings or connections.

From the foregoing it will be seen that by reason of the fact that the bight 28 of each wire clip is assembled in the base board 10 so that the said bight abuts against the upper surface of that board, it performs a double function. It precisely determines the protruding length of the straight portions 23, 24 of each clip beyond the lower face thereof. At the same time it backs up the clip against the base board 10 so that no matter what amount of force is used to plug in the board 11, it does not result in any permanent deformation of the clip. Furthermore the insertion force being limited by the abutting relation between the bight 28 and the base board 10 prevents this insertion force from being transmitted to the protruding portions of each clip in a direction normal to the soldered joint between the clip and the associated plated wiring 25. In other words, if the bight 28 were spaced from the base 10, the insertion of the board 11 would transmit a force normal to the plating 25 and would tend to disrupt the electrical connection to the clip. There is an additional advantage in using metal stock of round wire crosssection, namely that the clips can be forced through the insulating board 10 by a high pressure ramming machine of any known design since the wire stock can be extremely rigid in a direction perpendicular to the board 10 during the ramming operation. In fact, it has been found that with the clips as described, it is possible to ram the clips through the base board 10 without pre-perforating the said board and without distorting the clips during the ramming operation. This ramming operation is extremely difficult if not impracticable when clips are made of flat metal stock.

Figures 8, 9, 10, 11, 12, 13, 14, 15, 16:
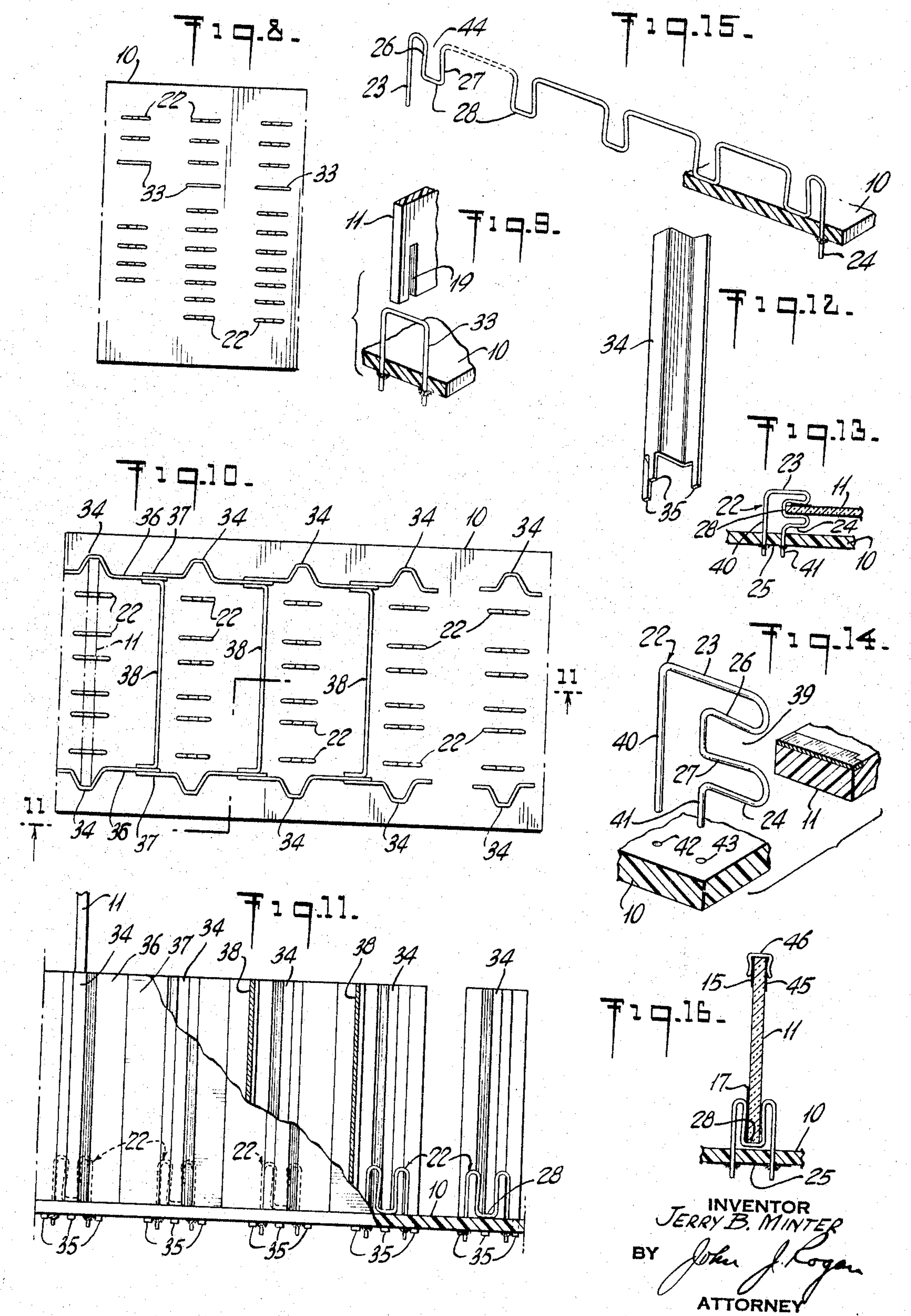
FIG. 8 is a top plan view of a modification of the keying arrangement of FIG. 3.
FIG. 9 is a perspective exploded view explanatory of the keying arrangement of FIG. 8.
FIG. 10 is a top plan view of a modification of the invention.
FIG. 11 is a broken-away sectional view taken along the line 11—11 of FIG. 10.
FIG. 12 is a detail perspective view of one of the plug-in guiding elements of FIGS. 10 and 11.
FIG. 13 is a sectional view of a modification of the contact clip of the preceding figures.
FIG. 14 is a perspective exploded view explanatory of the modification of FIG. 13.
FIG. 15 is a perspective view of a further modification of the clip of the invention.
FIG. 16 is a sectional view of a still further modification of the invention.

Instead of using rigid metal rods such as the rods 20 for guiding the plug-in board 11 in proper registry with the base 10 (FIG. 3), use may be made of inverted U-shape clips 33 as shown in FIGS. 8 and 9. These guiding clips may be made of the same wire stock as the contact clips 22 but are located in the base 10 in a plane normal to the planes of the contact clips so as to register with the appropriate guiding slots 19 in the plug-in member 11.

FIGS. 10 and 11 show a modification of the base 10 of FIGS. 1-9. The parts of FIGS. 10 and 11 which are the same as those of the preceding figures bear the same designation numerals. Located at opposite ends of each row of contact clips 22 and in alignment therewith are upstanding channeled guides 34. One of these guides is shown in perspective view in FIG. 12 and its lower end is provided with a set of integral tabs 35 which pass through corresponding openings in the insulating base 10. These lugs can be bent back against the lower face of base 10 so as to anchor the guides in perpendicular relation to the said base. If desired, although not necessarily, the flanged side portions 36 of adjacent guides may overlap and be welded as indicated by the numeral 37 to form, in effect, with the base 10 a rigid box-like structure. As indicated in FIG. 10 the plug-in members 11 are guided into the mouth or the entrance portions of the respective contact clips 22 by designing the width of each member 11 so that it is a slide fit within the cooperating member 34, thus insuring that the plug-in member is inserted in the right relation with respect to the said clips. In order to prevent accidental insertion of a plug-in member in the wrong direction, the welded flanges may be bridged by metal transverse partitions 38. The assembly consisting of the welded guide members thus provides a rigid box-like unit and the said metal guide members may also act in the nature of an electrostatic shield for the various plug-in units inserted into the respective guides. In some cases it may be desirable to provide individual guide members 34 without overlapping their flanges. Thus as shown in the right-hand section on FIG. 10, one side of contact clips 22 is provided at opposite ends with individual guides 34 whose flanges do not overlap with the adjacent guide member 34. The various contact members 22 of FIGS. 10 and 11 are shaped as hereinabove described and dimensioned so that the base of the bight portions 28 thereof abut against the insulating base 10 for purposes hereinabove described.

In all the foregoing embodiments, the plug-in member 11 carrying the printed circuits and circuit elements is shown as being plugged-in in a plane normal to the base 10. In certain cases it may be desirable to have the plug-in members 11 inserted in a plane substantially parallel to the base 10. Such an arrangement is shown in FIGS. 13 and 14 of the drawing. The contact springs 22 in this embodiment have their reentrant legs 26, 27 inclined with respect to the straight legs 23, 24 in the manner described above in connection with FIG. 6 so that the mouth 39 of each clip is slightly narrower than the thickness of the plug-in board 11 to provide the necessary wiping contact during the insertion of member 11. However, in this embodiment the lateral straight legs 23 and 24 are bent at right angles to provide straight portions 40, 41 which are assembled with a drive fit within the corresponding perforations 42, 43 in the base 10. It should be observed that in the embodiment of FIGS. 13 and 14, any force resulting from the insertion of the member 11 into the clips 22 will be in a direction substantially parallel to the base 10 and will not result in any substantial component of force normal to that base, thus reducing the likelihood of disruption between the protruding ends of portions 40 and 41. In this respect, therefore, the embodiment of FIGS. 13 and 14 is the same as that of the preceding figures.

The invention is not limited to the making of each contact clip in the form of a single M-shape member.

Thus as shown in FIG. 15, a length of wire of round cross-section may be formed with a series of reentrant or mouth portions 44 with the legs 26, 27 inclined to each other towards the mouth 44 as described above in connection with FIG. 6 and the opposite straight ends 23, 24 of the multi-reentrant shaped wire are anchored in the insulating base 10 as hereinabove described and with the bight portions 28 of each reentrant portion abutting against the said base 10 for purposes hereinabove described.

The invention of course is not limited to any particular design of plug-in member 11. Usually these members are in the form of insulation plates or rigid sheets carrying their printed circuit wirings 15, 16, etc. on one side of the insulation material (see FIG. 3). In some cases it may be desirable to form the plug-in member 11 of glass and to plate the circuit wiring on opposite surface of the glass member 11, as shown in FIG. 16 and represented by the platings 15 and 45. In order to connect the plated circuit element 15 on one side of member 11 with the element 45 on the opposite side of member 11 adjacent the upper edge of member 11, these circuit elements 15, 45, etc. are interconnected by a simple U-shape metal spring 46 which fits over the upper edge of the member 11 as seen in FIG. 16.

Various changes and modifications may be made in the disclosed embodiments without departing from the purpose and scope of the invention. It will be understood, of course, that while reference has been made herein to printed conductors on the respective boards, these conductors may be applied to the board by any well known operation such as spraying, etching, printing and the like.

I claim:

1. A connector device comprising
   a base of rigid insulation material,
   a contact clip to frictionally receive a plug-in member carrying a contact strip,
   said clip consisting of a single continuous length of rigid spring wire of rounded cross-section with two convexly curved loops joined by an intermediate concave loop,
   the said convexly curved loops each terminating in a respective linear portion rigidly anchored at their free ends directly in said base against movement therein and protruding from one face of said base a predetermined distance while the remainder of the clip is located on the opposite face of said base,
   said concave loop being positioned immediately adjacent said base so as to be in substantially abutting relationship therewith during insertion of said plug-in member,
   said convexly curved loops defining a mouth therebetween to receive said plug-in member,
   the normal width of said mouth being slightly less than the thickness of said plug-in member, and the distance between portions of said wire joining said mouth to said concave loop being slightly farther apart than the thickness of said plug-in member, whereby said strip is subjected to a continuous wiping action during insertion of the plug-in member and said plug-in member is flexibly gripped by the clip to hold it in predetermined relation to said base,
   the contact between the plug-in member and clip being independent of pressure engagement between the said member and the bottom of said concave loop,
   said clip being supported and attached to said base entirely by reason of said anchoring of said free ends,
   and the remainder of the clip being free from mechanical abutment against any rigid supports, except the abutting relationship of said concave loop and said base, whereby the normal width of said mouth is determined solely by the normal preformed curvature and bias of said concave and convex loops and the said mouth is automatically widened solely by reason of the engagement between the mouth of the clip and the inserted plug-in member.

2. An M-shaped low electrical impedance connector clip made of self-supporting resilient wire of rounded cross-section for attachment to a rigid insulating base comprising first and second substantially straight, parallel outer legs terminating at one end, respectively, in first and second convex loops joined together by an intermediate concave loop, all of said loops lying in substantially the same plane, said clip being adapted to receive the conductive edge of a rigid member between said first and second loops, said first and second loops having contacting areas closer together than the ends of said concave loop, the distance between said contacting areas being slightly less than the thickness of said edge and the distance between said other points being slightly greater than the thickness of said edge whereby said edge is gripped resiliently by said contacting areas, the distance from the centers of said first and second loops to the center of said concave loop being less than the distance from the centers of said first and second loops to the ends of said straight outer legs by a distance sufficient whereby said clip to be self-supported from said rigid insulating base by the ends of said outer legs with said concave loop in abutting relationship with said base.

3. The connector clip of claim 2 in which all parts of said clip on one side of the center of said concave loop are substantially mirror images of parts on the other side of said center.

4. A low electrical impedance contact clip of resilient, self-supporting wire of rounded cross-section bent to have a U-shaped central portion comprising a central loop and two sides extending from the ends of said loop to receive the edge of a rigid member between said sides, said sides being slightly inclined toward each other whereby the normal distance between said sides near said loop is at least as great as the thickness of said edge inserted therebetween, and the distance between the other ends of said sides engaging said edge being normally less than the thickness of said edge, said other ends terminating in outwardly-bent, smoothly curved loops forming a mouth for said U-shaped portion, the outer ends of said loops comprising legs extending substantially parallel to each other and substantially parallel to said sides of said U-shaped portion, said entire clip being self-supporting from said ends of said legs, and said central portion, loops, and ends all being coplanar, whereby said clip can be self-supported from a rigid insulating base by the ends of said legs with said central loop in abutting relationship with said base.

5. The clip of claim 4 in which the central portion of said bight is substantially straight and perpendicular to said ends.

6. A connector comprising a base of insulating material of predetermined thickness and having a pair of spaced apertures therethrough; and a contact clip to frictionally engage the conductive edge of a rigid strip, said clip comprising a single continuous length of resilient wire of rounded cross-section and being formed with first and second convex loops joined by an intermediate concave loop, all of said loops lying in substantially the same plane, the free ends of said first and second loops being spaced apart substantially the same distance as said apertures and extending parallel to each other through said apertures and being anchored to said base to be self-supporting therein, said first and second loops defining, between contacting areas thereof, a mouth to receive said edge, the distance between said contacting areas being slightly less than the distance between other points of said concave loop between said contacting areas and the central portion of said concave loop and slightly less than the thickness of the portion of said strip inserted between said first and second loops, the distance between said other points being greater than the thickness of said portion of said strip, whereby said strip is subjected to a continuous wiping action during insertion of said strip into said mouth, said free ends of said first and second loops extending beyond said concave loop by a distance greater than the thickness of said base, and said central portion of said concave loop normally abutting the surface of said base to receive support therefrom when said edge is inserted into said mouth.

References Cited

UNITED STATES PATENTS

| | | | |
|---|---|---|---|
| 2,802,188 | 8/1957 | Badders | 339—17 |
| 2,904,768 | 9/1959 | Rasmussen | 317—101 |
| 3,048,811 | 7/1962 | Lock | 339—17 |

ROBERT K. SCHAEFER, *Primary Examiner.*

W. C. GARVERT, D. SMITH, Jr., *Assistant Examiners.*